United States Patent
Berggren et al.

(10) Patent No.: US 8,095,326 B2
(45) Date of Patent: Jan. 10, 2012

(54) METHOD AND DEVICE TO PREDICT A STATE OF A POWER SYSTEM IN THE TIME DOMAIN

(75) Inventors: Bertil Berggren, Vasteras (SE); Tord Bengtsson, Vasteras (SE); Stefan Roxenborg, Vasteras (SE)

(73) Assignee: ABB Research Ltd. (CH)

( * ) Notice: Subject to any disclaimer, the term of this patent is extended or adjusted under 35 U.S.C. 154(b) by 65 days.

(21) Appl. No.: 12/633,444

(22) Filed: Dec. 8, 2009

(65) Prior Publication Data

US 2010/0088048 A1  Apr. 8, 2010

Related U.S. Application Data (63) Continuation of application No. PCT/EP2007/055670, filed on Jun. 8, 2007.

(51) Int. Cl.
G01R 11/54 (2006.01)
G01R 13/08 (2006.01)
G01R 13/16 (2006.01)
G01R 13/30 (2006.01)

(52) U.S. Cl. ............ 702/58; 702/73; 702/75; 702/77

(58) Field of Classification Search .......... 702/57, 702/58, 59, 64, 75, 77, 141, 179, 182; 330/2; 375/296; 700/293

See application file for complete search history.

(56) References Cited

U.S. PATENT DOCUMENTS

| | | | | |
|---|---|---|---|---|
| 5,483,462 | A * | 1/1996 | Chiang | 700/293 |
| 5,719,787 | A * | 2/1998 | Chiang et al. | 700/293 |
| 5,966,675 | A * | 10/1999 | Koeck | 702/58 |
| 6,597,999 | B1 * | 7/2003 | Sinha et al. | 702/64 |
| 6,917,888 | B2 | 7/2005 | Logvinov et al. | |
| 7,010,436 | B2 * | 3/2006 | Larsson et al. | 702/57 |
| 2007/0052426 | A1 | 3/2007 | Wells et al. | |

OTHER PUBLICATIONS

International Search Report and Written Opinion of the International Searching Authority; PCT/EP2007/055670; May 2, 2008; 11 pages.
Kurogi, et al.; "Time Series Prediction of the CATS Benchmark Using Fourier Bandpass Filters and Competitive Associative Nets"; Neurocomputing, Elsevier Science Publishers; Amsterdam, NL, vol. 70, No. 13-15; May 31, 2007; pp. 2354-2362.

* cited by examiner

*Primary Examiner* — Mohamed Charioui
*Assistant Examiner* — Felix Suarez
(74) *Attorney, Agent, or Firm* — St. Onge Steward Johnston & Reens LLC (57) ABSTRACT

A method to predict a state of a power system and a device to perform the method are presented, where the method includes the step of performing a Fast Fourier Transform on samples of a periodic waveform signal in order to determine a frequency spectrum of the signal, where the signal was derived from at least one measurable electric quantity of the power system and is representative for the state of the power system. Frequencies and related complex amplitudes at selected peaks in the frequency spectrum are determined and stored together with a time stamp. Afterwards, a predicted value of the periodic waveform signal in the time domain is determined at a prediction time by calculating a sum of sinusoidal signals at the prediction time, where each of the sinusoidal signals is characterized by one of the determined frequencies and its related complex amplitude as well as the time stamp.

10 Claims, 7 Drawing Sheets

METHOD AND DEVICE TO PREDICT A STATE OF A POWER SYSTEM IN THE TIME DOMAIN

CROSS-REFERENCE TO RELATED APPLICATIONS

The present application is a continuation of pending International patent application PCT/EP2007/055670 filed on Jun. 8, 2007 which designates the United States, the content of which is incorporated herein by reference.

FIELD OF THE INVENTION

The invention relates to a method and a device to predict a state of a power system by performing a Fast Fourier Transform on samples of a periodic waveform signal in order to determine a frequency spectrum of the periodic waveform signal, where the periodic waveform signal was derived from at least one measurable electric quantity of the power system and is representative for the state of the power system. In the device, the Fast Fourier Transform is performed by at least one processing unit which receives the samples of the periodic waveform signal from at least one storage unit.

BACKGROUND OF THE INVENTION

The term power system comprises power generation as well as power transmission and distribution systems and their power related components, such as power generators, power transformers, breakers, transmission and distribution lines etc.

Nowadays, the operation of a power system is continuously monitored in order to collect data about the operational state of the system and to be able to react quickly on deviations from the normal operation state and especially on faults. The collected data may additionally be stored to use them at a later time for evaluation purposes. The monitoring is usually based on measurements of electric quantities of the power system. As a result, to monitor means nowadays to detect events only after they have occurred.

In recent developments, monitoring was supplemented by the aspect of predicting a fault in a power system in order to overcome the problem that conventional monitoring only allows a reaction on a fault after the fault has happened and possible damage was done. In U.S. Pat. No. 6,917,888 B2, a method to detect faults in a power line network is described where faults are anticipated based on frequency data. In US 2007/0052426 A1, a failure prediction method for a power transformer is described which uses a frequency domain transfer function of the transformer to estimate the health of the transformer. The frequency domain transfer function can be computed using a Fast Fourier Transform (FFT) of measured input and output wave forms of the transformer.

In both documents solely the aspect of failure prediction is addressed and in both methods, the failure prediction is carried out in the frequency domain.

It is an object of the present invention to provide a method and a device of the kind described above which allows the prediction of a state of a power system to be used for more than just failure prediction purposes.

SUMMARY OF THE INVENTION

This object is achieved by the methods and devices described herein.

According to one advantageous embodiment of the invention, the frequency spectrum of the periodic waveform signal is used to determine frequencies and related complex amplitudes at selected peaks in the frequency spectrum. The frequencies and corresponding complex amplitudes are stored together with a time stamp. For an ideally sinusoidal signal only one frequency and complex amplitude is to be determined, while for real-life periodic waveform signals of a power system, such as voltage, current, active or reactive power, a list of several frequencies and corresponding complex amplitudes is derivable. The list of frequencies and complex amplitudes is used in the next step to determine a predicted value of the periodic waveform signal in the time domain. Therefore a prediction time is chosen and a sum of sinusoidal signals is calculated at the prediction time, where each of the sinusoidal signals is characterized by one of the determined frequencies and its related complex amplitude as well as the time stamp.

In a preferred embodiment, the predicted value is determined based on the equation:

$$\phi_p = \text{Re}\left[\sum_i (A_i \cdot e^{2\pi f_i(t_p - t_0)})\right] \quad \text{Equation 1}$$

where $\phi_p$ is the predicted value i is an index to consecutively number the determined frequencies $f_i$ and their corresponding complex amplitudes $A_i$, $t_0$ is the time stamp when the frequencies $f_i$ and amplitudes $A_i$ were determined and $t_p$ is the prediction time.

In an embodiment, the frequencies and related complex amplitudes are determined from those peaks in the frequency spectrum whose amplitude exceeds a predetermined amplitude limit. Additionally or alternatively, the frequencies and related complex amplitudes may be determined after the frequency spectrum was filtered with a frequency filter.

By predicting a value of the periodic waveform signal in the time domain it becomes possible to determine, when exactly the periodic waveform signal reaches a certain amplitude or phase angle under normal operating conditions. Such information may be used to trigger a certain control action in the power system.

Since control actions usually require that the information the control decision is based upon is determined reliably and with shortest possible delay time, in one advantageous embodiment a computing device with a real-time operating system is used to perform the step of determining the predicted value simultaneously with the steps of performing a Fast Fourier Transform and of determining the frequencies and related complex amplitudes.

To determine the point in time when the periodic waveform signal reaches a predetermined amplitude or phase angle, in one embodiment, a consecutive sequence of predicted values is determined at consecutive prediction times and to determine the one of the consecutive prediction times when the sequence of predicted values reaches the predetermined amplitude or phase angle is determined.

A control action can then be initiated in the power system at the best suitable point in time, when for example negative side effects of the control action are at a minimum or when the impact of the control action is at a maximum. Depending on the reaction time of the power system to the control action, the control action can be initiated either when the real time reaches precisely the predetermined point in time or it can be initiated at a certain time before the predetermined point in time, where the certain time is chosen in dependence on an expected delay in the reaction of the power system to the control action.

The prediction of amplitude or phase angle of the periodic waveform signal can for example be applied to the switching of a power breaker. A breaker should ideally be switched at zero current through the breaker, so that no current is interrupted during the switching operation which would lead to increased wear of the breaker contacts. Accordingly, it is advantageous to predict the zero current crossing of the breaker current by determining the point in time when the breaker current is supposed to reach zero Ampere and to initiate the switching of the breaker to occur at exactly the zero current crossing in order to reduce the breaker wear.

So far it was described, how the predicted value of a periodic waveform signal may be used to predict the point in time when a predetermined amplitude or phase angle is reached under normal operating conditions and how this predicted point in time may be used to improve the accuracy of control action initialisation.

According to another embodiment, the method to predict a value of a periodic waveform signal in the time domain is used to detect a fault in the power system. Therefore the predicted value is compared with a measured value derived from a measurement of the at least one electric quantity of the power system, where the prediction time equals the point in time when the measurement is taken. Since it is often hardly possible to measure at a precisely given point in time, it is regarded as an inferior solution to first predict a value and then to try to measure at exactly the prediction time. A better way is first to determine the list of frequencies and related complex amplitudes from the frequency spectrum, second to measure the at least one electric quantity, third to determine the point in time when the measurement actually was taken, fourth to predict the value at a prediction time which equals the measuring instant and fifth to compare the measured and the predicted value. If a difference between the predicted value and the measured value exceeds a predetermined limit, an unexpected change in the state of the power system is notified in order to initiate further actions. The further actions can be different depending on the kind of the electric quantity and on the features of the power system. In the simplest case, a faulty state of the power system can be notified right away if the difference between the predicted value and the measured value exceeds the predetermined limit. This could for example be possible if a considerable difference between a predicted and a measured voltage value indicates a short circuit. In most other cases, further analysis will be initiated. Such analysis can include searching for specific patterns in the time development of the at least one electric quantity, which requires further measurements, which can be measurements derived before or after the prediction time. The further analysis may be performed either on-line on the same or a connected processing unit or off-line. Since the prediction method provides not only an indication of an unexpected change of the state of the power system but also an exact point in time when the state changed, all necessary data from before and after the event can be stored in order to be used for the further analysis. This enables the development and use of advanced algorithms for fault and state detection in the power system.

Apart from just sporadically comparing a predicted with a measured value it is arranged in another embodiment to determine multiple predicted values of the periodic waveform signal at multiple prediction times and to compare each of the multiple predicted values with a measured value derived from a measurement of the at least one electric quantity of the power system, where the multiple prediction times each equal to the point in time when the corresponding measurement was taken. An unexpected change in the state of the power system is notified if a predetermined number of differences between the multiple predicted values and the corresponding measured values each exceed a predetermined limit.

The method according to this embodiment can be performed online, where the at least one electric quantity of the power system is measured constantly and compared to predicted values as fast as the measurements are performed. The measured values are stored and are used to continuously derive an updated frequency spectrum and an updated set of frequencies and related complex amplitudes from the frequency spectrum.

The notification of the unexpected change in state may be done in various ways known in the art such as outputting an acoustic, visual or haptic information to an operator or to generate a message and to display and store the message. The initiation of further actions can then be performed either automatically or manually by the operator. The state of the power system which is to be predicted can be for example the absence of short-circuits, the availability of a power transmission line in a power grid or the quality of operation of a tap changer of a power transformer. An unexpected change in state would in these examples be an indication for that a short-circuit is detected or that the power transmission line is lost or that the tap changer does not function properly.

In another embodiment, a change in the periodic waveform signal is intentionally provoked and the change is recorded by storing a consecutive sequence of predicted values at consecutive prediction times. The change in the periodic waveform signal can for example be provoked by stepwise changing a reference signal for a control unit in the power system, the control unit being for example connected to a converter or filter unit in the power system. Another example for a provoked change is the stepping of a tap changer of a power transformer.

In a further development of the embodiment, the recorded sequence of predicted values is compared with an expected sequence of the periodic waveform signal and the result of the comparison is used to evaluate the state of the power system.

In the device according to the invention the at least one processing unit is arranged to determine frequencies and related complex amplitudes at selected peaks in the frequency spectrum, to store the frequencies and amplitudes together with a time stamp in the storage unit, to determine a predicted value of the periodic waveform signal in the time domain at a prediction time by calculating a sum of sinusoidal signals at the prediction time, each of the sinusoidal signals being characterized by one of the determined frequencies and its related complex amplitude as well as the time stamp, and to store the predicted value in the storage unit. The storage unit can be either a contemporary storage unit such as a RAM from where data can be transmitted to a permanent storage unit afterwards or the storage unit can be a permanent storage unit such as ROM, hard disk, memory or flash memory card etc. The processing unit can be any unit able to receive, process and output digital information, such as a CPU, a microcontroller, a digital signal processor, an ASIC, a FPGA or a higher level processing device like an embedded computer.

In a special embodiment, the processing unit is a digital processing unit running under a real-time operating system, where the processing unit determines the predicted value in a thread with high priority and performs the Fast Fourier Transform and determines the frequencies and related complex amplitudes in a thread with low priority.

The device can for example be part of a protective relay or of a monitoring system distributed in a wide area.

BRIEF DESCRIPTION OF THE DRAWINGS

The invention is now described by way of example with reference to the accompanying drawings in which.

DETAILED DESCRIPTION OF THE INVENTION

Figure 1:
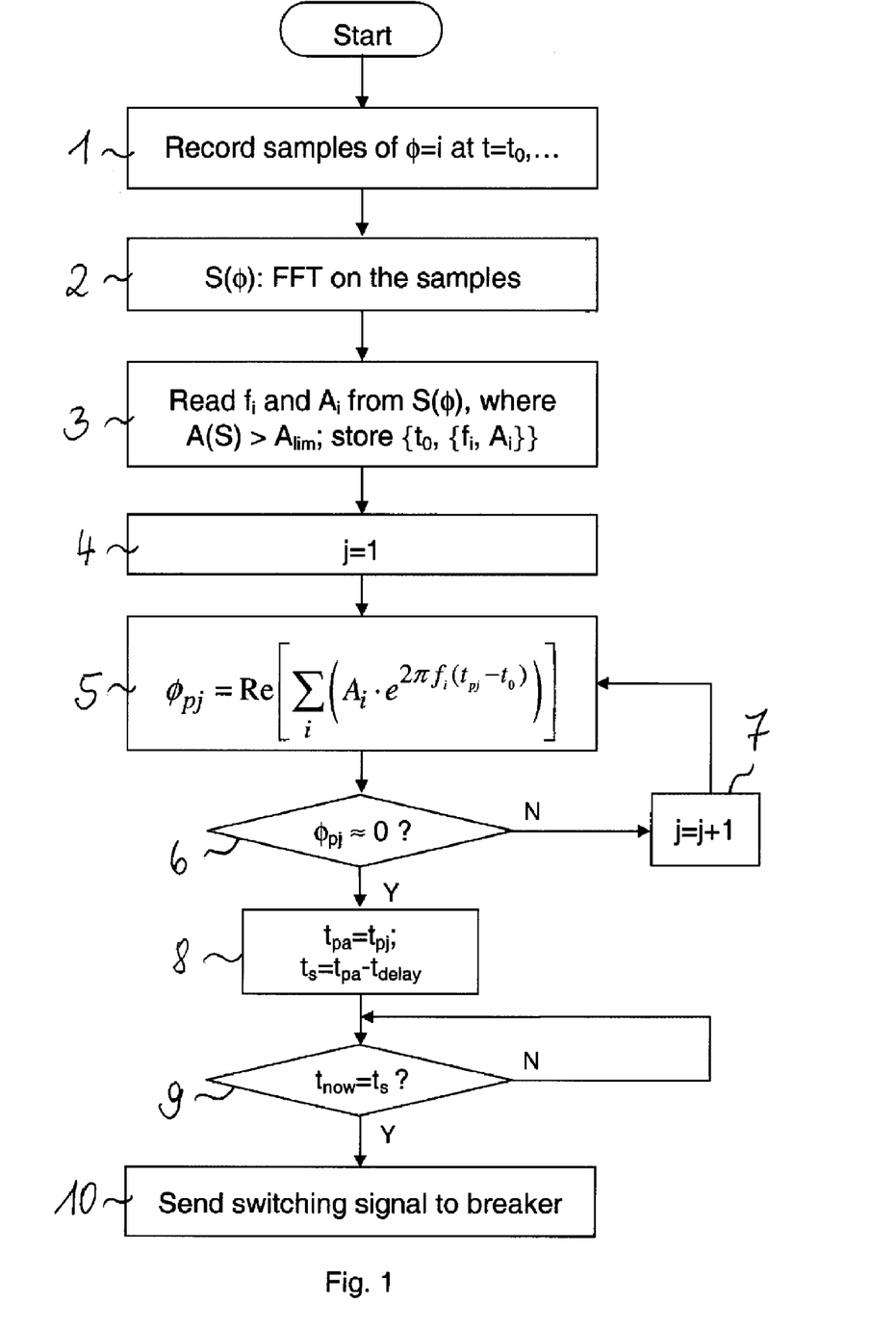
FIG. 1 shows the flow chart of a method where a power breaker is switched at a predetermined point in time.
Figure 6:
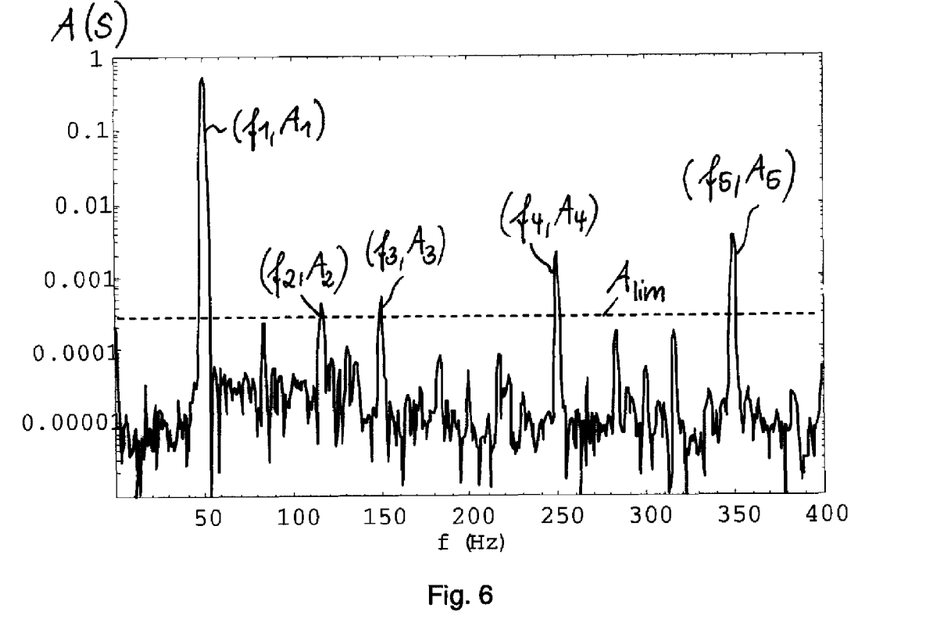
FIG. 6 shows a frequency spectrum of a periodic waveform signal.

FIG. 1 shows a flowchart of a method to predict a future point in time when a current i through a breaker crosses zero. In step 1 the samples of a periodic waveform signal $\phi$ are recorded at consecutive points in time t, beginning at time $t_0$, where the periodic waveform signal $\phi$ is equal to the current i through the breaker. Afterwards, in step 2, a FFT is performed on the samples of the periodic waveform signal $\phi$ in order to generate a frequency spectrum $S(\phi)$. An example for a frequency spectrum is shown in FIG. 6. From the frequency spectrum $S(\phi)$ certain peaks are selected by comparing the amplitudes $A(S)$ in the spectrum with a predetermined amplitude limit $A_{lim}$. Those peaks whose amplitude $A(S)$ exceeds the predetermined amplitude limit $A_{lim}$ are selected and stored with the timestamp $t_0$ (step 3), where the timestamp $t_0$ indicates the point in time when the measurement samples to determine the frequencies $f_i$ and the corresponding complex amplitudes $A_i$ were recorded. In the example of FIG. 6, five frequencies $f_i$ and their related complex amplitudes $A_i$ are determined. In the next steps 4 to 7, a loop is run to determine predicted values $\phi_{pj}$ of the periodic waveform signal in the time domain at consecutive prediction times $t_{pj}$ by calculating a sum of sinusoidal signals at the corresponding prediction time $t_{pj}$, where each of the sinusoidal signals is characterized by one of the determined frequencies $f_i$ and its related complex amplitude $A_i$ as well as the time stamp $t_0$. For each of the predicted values $\phi_{pj}$ it is checked in step 6 if the value is closest to zero, i.e. if the predicted value $\phi_{pj}$ indicates the zero crossing of the current i. If a predicted value $\phi_{pj}$ is not equal or closest to zero, the next predicted value $\phi_{p(j+1)}$ is calculated. Otherwise, if the predicted value $\phi_{pj}$ is detected to be the one closest to zero, its corresponding prediction time $t_{pj}$ is saved as zero crossing time $t_{pa}$, and the switching time $t_s$ when the breaker is to be switched is calculated as difference between the zero crossing time $t_{pa}$ and a predetermined delay time $t_{delay}$, which corresponds to the reaction time of the breaker to a switching signal (step 8). In the next step 9, the real point in time $t_{now}$ is compared with the switching time $t_s$, and when the switching time $t_s$ is reached a switching signal is sent to the breaker in step 10.

Figure 2A:
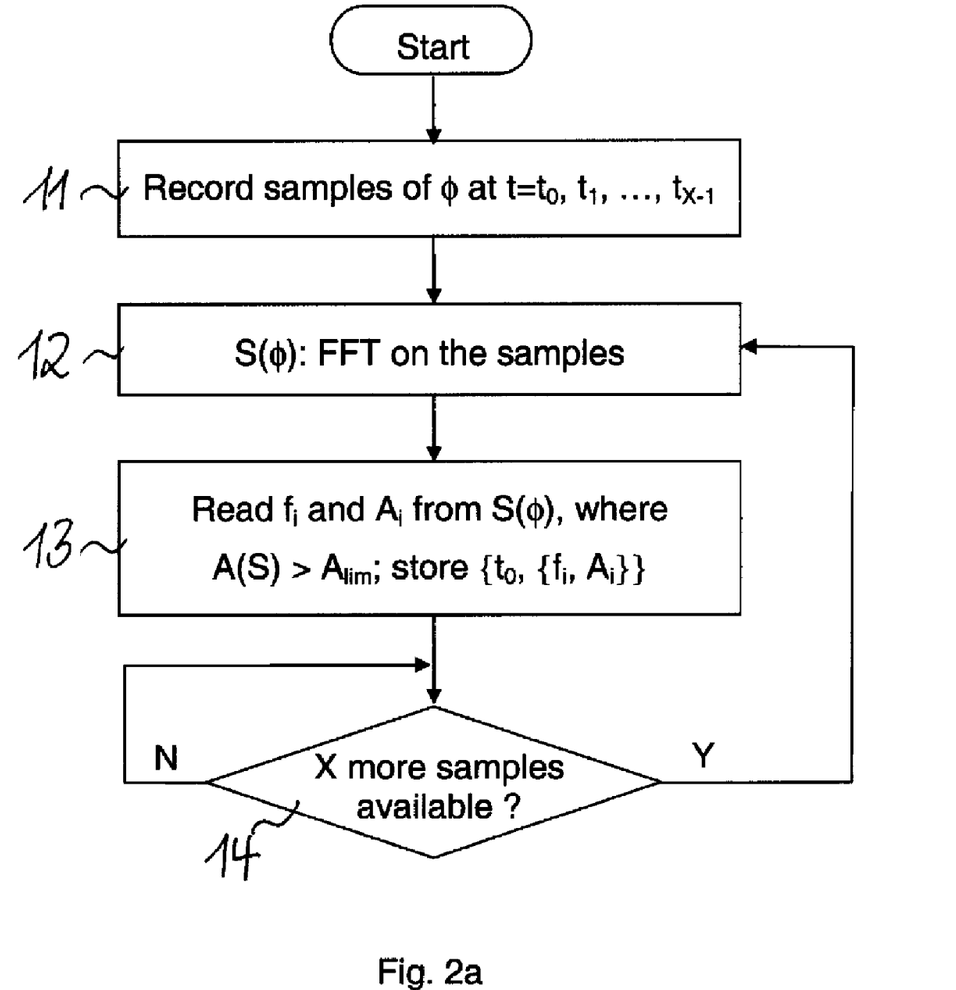
FIG. 2*a* shows the first routine of a method where the method consists of two routines running in parallel to each other.

FIG. 2*a* shows the first routine of a method where two routines run in parallel. The first routine samples a periodic waveform signal (I) and processes the samples in order to provide continuously updated sets of frequencies $f_i$ and related complex amplitudes $A_i$. The second routine uses the respective latest set to determine predicted values and to compare them with newly measured values of the periodic waveform signal. Steps 11 to 13 of FIG. 2*a* are the same as steps 1 to 3 of FIG. 1, with the only difference that any periodic waveform signal $\phi$ derived from at least one measurable electric quantity of a power system can be subject of the method. The number of samples to be taken in step 11 is predefined as X. While the frequency spectrum $S(\phi)$ and the frequencies f, as well as the amplitudes $A_i$ are determined, the sampling of the periodic waveform signal $\phi$ continues in the background. In step 14, it is checked if meanwhile enough new samples of the periodic waveform signal $\phi$ were taken to reach the predetermined number X again. If not, it is waited until the predetermined number X is reached. When enough new samples are taken, the method returns to step 12 in order to perform an FFT on the new samples and to generate an updated set of frequencies $f_i$ and amplitudes $A_i$ from the resulting frequency spectrum $S(\phi)$. The updated frequencies $f_i$ and amplitudes $A_i$ are then stored together with their updated timestamp $t_0$, so that the former set of data is overwritten.

Figure 2B:
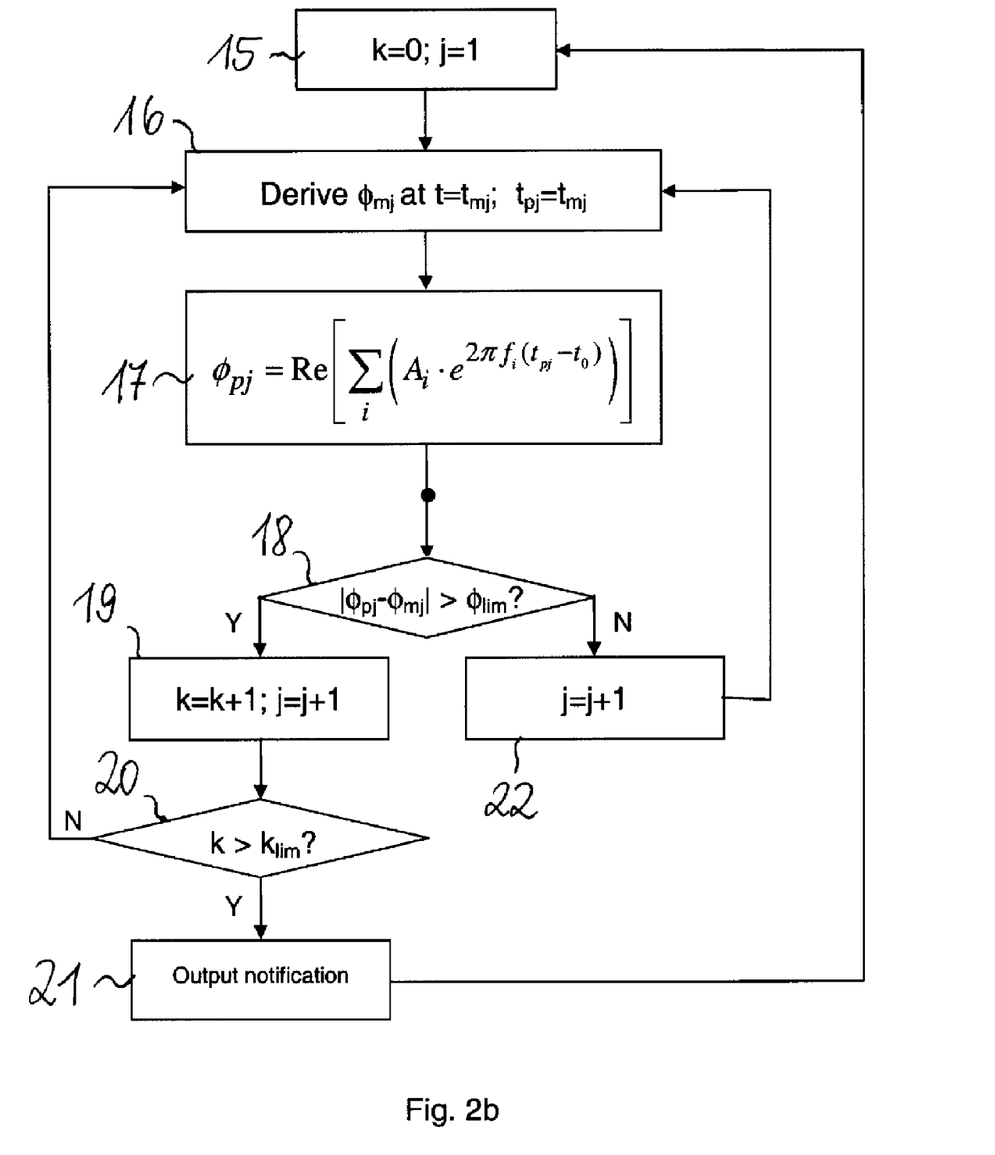
FIG. 2*b* shows the second routine of the method with the two parallel routines.

In parallel to the first routine of FIG. 2*a*, a second routine is run which is depicted in FIG. 2*b*. In step 15, a counter k is set to zero and an index j is set to one. In the next step 16, a new sample $\phi_{mj}$ of the periodic waveform signal $\phi$ is taken, derived from a new measurement of the at least one electric quantity of the power system, where the measurement is taken at the measuring instant $t_{mj}$. Even if the sample $\phi_{mj}$ does not necessarily need to be a measurement itself but can be the result of data processing of a measurement of the at least one electric quantity, the sample $\phi_{mj}$ is called measured value $\phi_{mj}$ in the following. For the same time instant as the measured value $\phi_{mj}$ was taken, a predicted value $\phi_{pj}$ is now to be determined. This is why the prediction time $t_{pj}$ is set equal to the measuring instant $t_m$. In step 17, the predicted value $\phi_{pj}$ is determined at the prediction time $t_{pj}$ in an analogue way to step 5 of FIG. 1, where the determination is based on the latest result of the first routine of FIG. 2*a*, i.e. the latest set of frequencies $f_i$ and their related complex amplitude $A_i$ as well as the time stamp $t_0$. In step 18, the absolute value of the difference between the predicted value $\phi_{pj}=\phi_{p1}$ and the measured value $\phi_{mj}=\phi_{m1}$ is calculated. The difference is compared with a predetermined limit $\phi_{lim}$.

If the difference does not exceed the predetermined limit $\phi_{lim}$, the index j is increased by one in step 22 and the method returns to step 16 in order to determine the next measured value $\phi_{mj+1}=\phi_{m2}$ and the next predicted value $\phi_{pj+1}=\phi_{p2}$ and to compare them. If the difference exceeds the predetermined limit $\phi_{lim}$, the counter k is increased by one as well as the index j (step 19). In the next step 20, the counter is compared with a counter limit $k_{lim}$. If the counter limit $k_{lim}$ is not exceeded, the method returns to step 16 to determine the values for the next comparison. Otherwise, a notification is generated that a change in the state of the power system has occurred, which may then lead to the initiation of further analysis or action. The exceeding of the counter limit $k_{lim}$ indicates that a predetermined number of differences between the predicted values $\phi_{pj}$ and the corresponding measured values $\phi_{mj}$ each exceed the predetermined limit $\phi_{lim}$. After generating the notification, the method returns to step 15 in order to start with the second routine from the beginning, using an updated set of frequencies $f_i$ and related complex amplitudes $A_i$.

Figure 7:
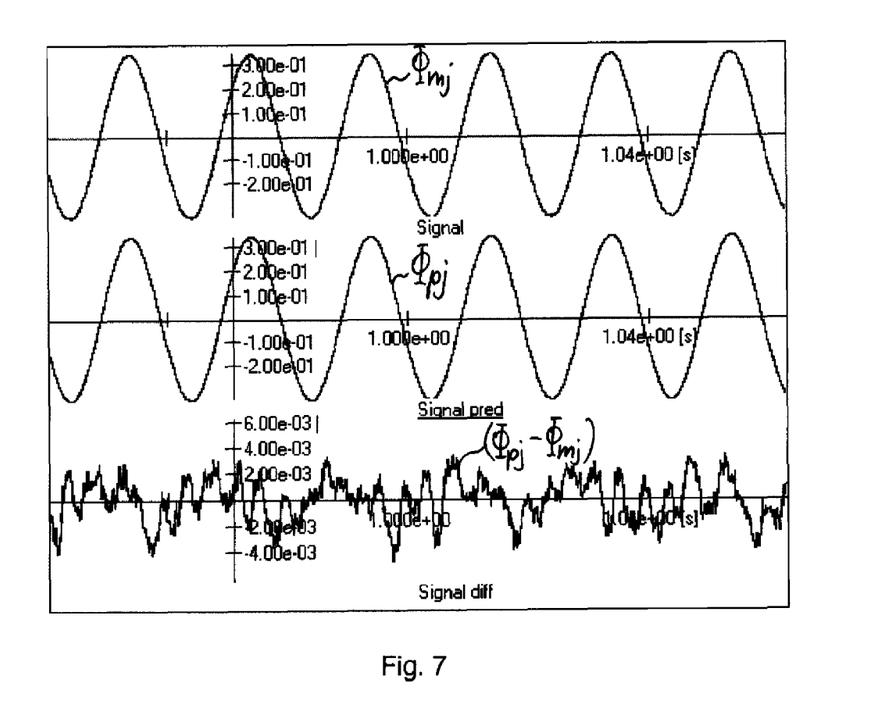
FIG. 7 shows the time diagrams of predicted and measured consecutive values of a periodic voltage signal as well as their difference.
Figure 9:
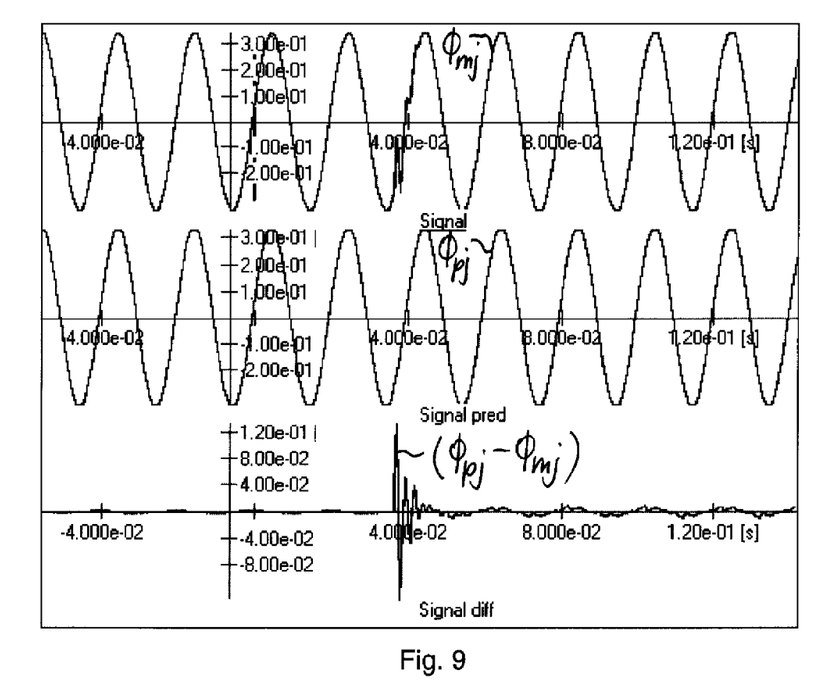
FIG. 9 shows the time diagrams of predicted and measured consecutive values of a periodic voltage signal as well as their difference while a tap changer was stepped and an electric arc occurred during the tap changer operation.

FIG. 7 shows the time diagrams of predicted values $\phi_{pj}$ and of measured values $\phi_{mj}$ given in normalised values, where the corresponding periodic waveform signal $\phi$ is a voltage signal of a power distribution line. Additionally, the difference between the predicted values $\phi_{pj}$ and the measured values $\phi_{mj}$, ($\phi_{pj}-\phi_{mj}$), is depicted. In the example of FIG. 9, the difference is always smaller than a predetermined limit $\phi_{lim}$ of 0.02.

Figure 3:
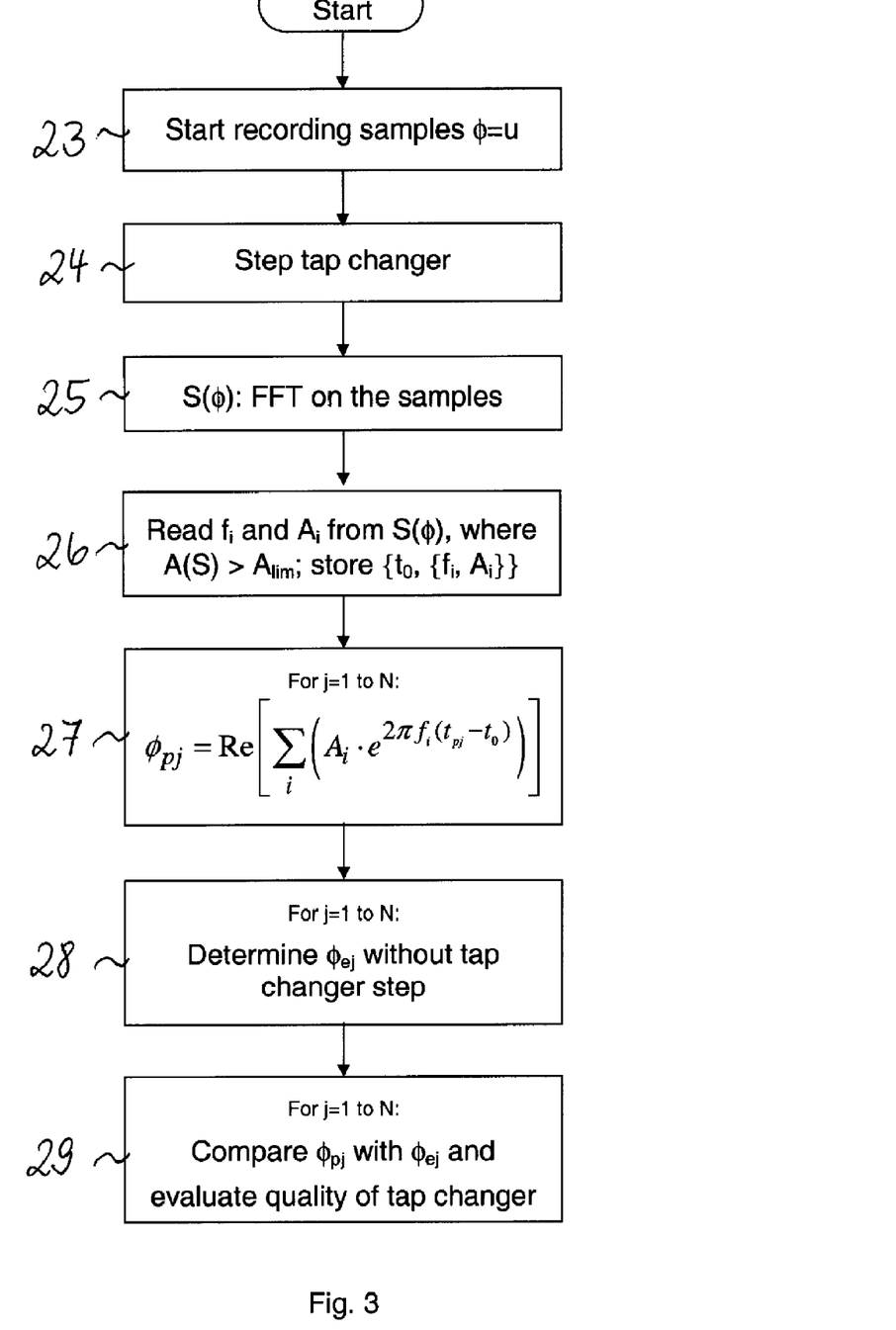
FIG. 3 shows a flow chart of a method, where the quality of operation of a tap changer is evaluated.

FIG. 3 shows a flow chart of a method, where the quality of operation of a tap changer is evaluated. The tap changer is connected to a power transformer and the power transformer is part of a power transmission or distribution system. In the first step 23 of the method, the recording of samples of a periodic waveform signal $\phi$ is started, where the periodic waveform signal $\phi$ is derived from measuring the voltage u in the power transmission or distribution system. In the next step 24, a control action is performed by stepping the tap changer so that the transformation ratio of the power transformer changes. As a result, the voltage in the power transmission or distribution system should change, too. The next steps 25 and 26 are the same as steps 12 and 13 of FIG. 2a. In step 27, a number of N predicted values $\phi_{pj}$ of the periodic waveform signal $\phi$ is determined at consecutive prediction times $t_{pj}$. In step 28, an expected sequence of values $\phi_{ej}$ of the periodic waveform signal $\phi$ is determined where it is assumed that no tap changer step occurred. Accordingly, the expected values $\phi_{ej}$ reflect the expected voltage of the power transmission or distribution system without a change in the transformation ratio. In the next step 29, the predicted values $\phi_{pj}$ and the expected values $\phi_{ej}$ are compared and the result of the comparison is used to evaluate the quality of the tap changer operation. Since the predicted and expected values are both time dependent, it can not only be evaluated if the expected amplitude of voltage change was accomplished but also if the voltage change occurred within the expected time frame and if disturbances on the voltage remained within the required limits.

Figure 8:
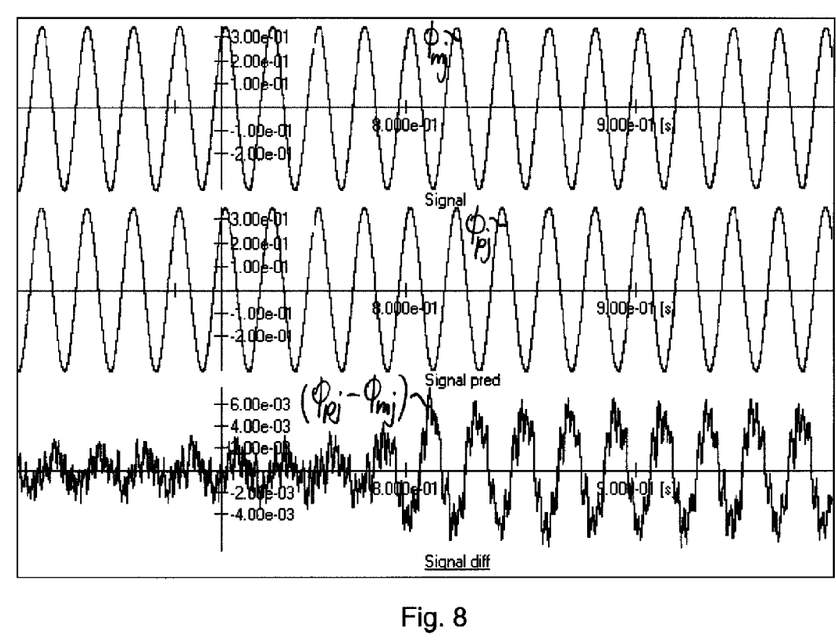
FIG. 8 shows the time diagrams of predicted and measured consecutive values of a periodic voltage signal as well as their difference while a tap changer was stepped.

In order to show the applicability of the method according to FIG. 3, FIGS. 8 and 9 are included with the time diagrams of normalised predicted and measured consecutive values of a periodic voltage signal and of their difference ($\phi_{pj}-\phi_{mj}$) while a tap changer was stepped. In both cases, the tap changer step was not taken into account when determining the predicted values $\phi_{pj}$ but instead it was the aim to see how clearly a voltage change can be detected and if a problematic tap changer step could be distinguished from normal operation. As can be seen in FIG. 8, which shows a normal tap changer step, the voltage amplitude changed significantly and afterwards remained on a constant level, while the voltage frequency stayed unchanged during the whole operation. However, FIG. 9 depicts a tap changer step where an arcing occurred. The difference between the predicted and the expected values ($\phi_{pj}-\phi_{mj}$) which is reached during the arcing has a multiple order of magnitude of the normal difference level of FIG. 8. Apart from that, an indication for the arcing could also be derived from the highly frequent oscillations in the voltage signal. Accordingly, the problematic tap changer step is clearly distinguishable from the normal one, so that in the case of FIG. 9 a notification could be saved in a log file and/or sent to an operator in form of a text message stating that the arcing occurred but that the tap changer step was still successful since the voltage was adjusted afterwards on the expected level and frequency.

Figure 4:
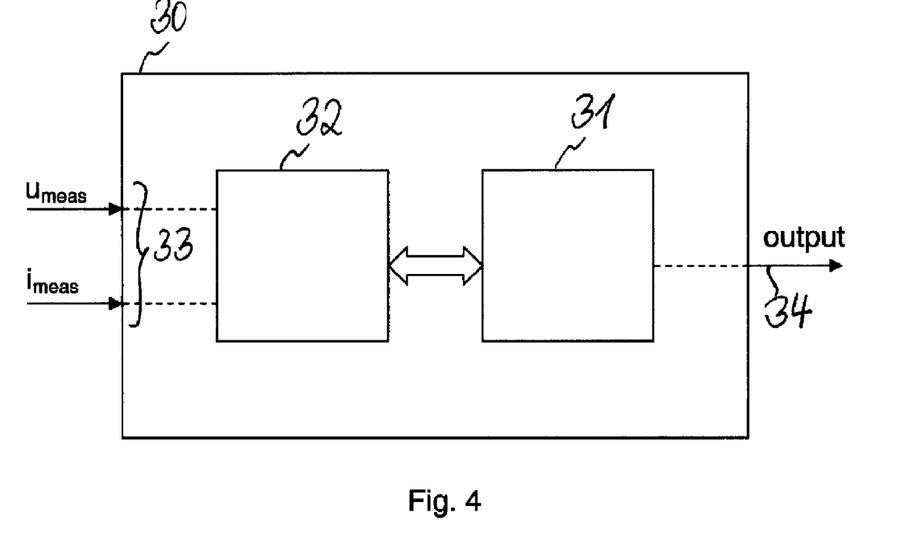
FIG. 4 shows a device with a processing unit and a storage unit to perform the method according to the invention.

In FIG. 4, a device 30 is shown with a processing unit 31 and a storage unit 32. The device 30 receives via input ports 33 measurements of electric quantities of a power system such as measured voltages $u_{meas}$ and currents $i_{meas}$. At least one output port 34 is connected to an external unit, which can be an external storage device, a display, a loudspeaker, a remote control device or a central monitoring device. The at least one output port 34 is used to transmit a possible notification information to the external unit in order to output or save it, where the notification information can be in the form of text, graphics or an acoustic signal. The at least one output port 34 is used additionally or alternatively to transmit various data derived during performing of one of the methods presented above in order to store, display or otherwise further process the data, where the data can be for example the predicted and expected or measured values as well as the results of their comparison.

Figure 5:
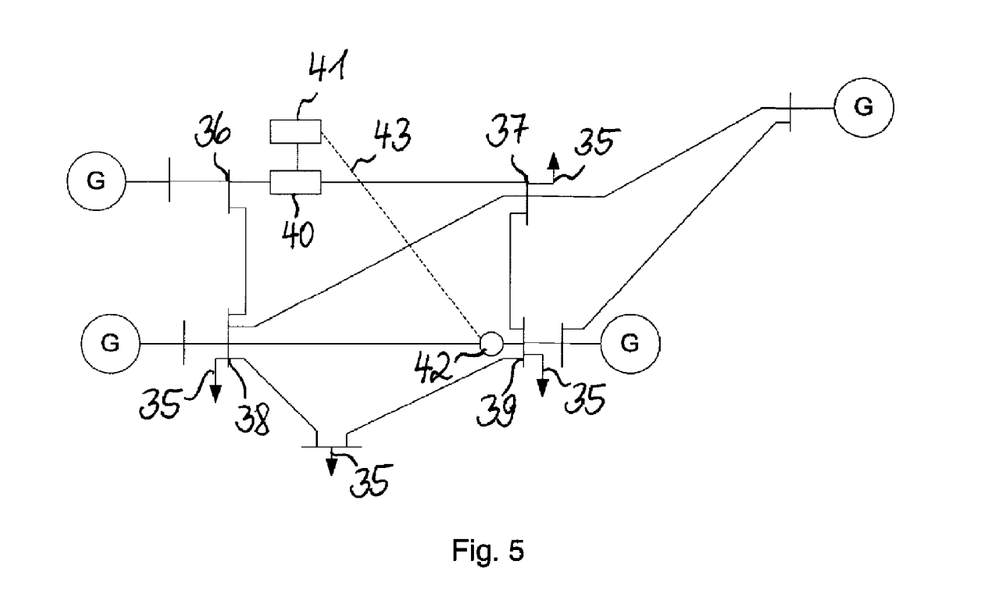
FIG. 5 shows a power system where a method to predict a state in the time domain is applied to detect a lost power line.

FIG. 5 shows a power system comprising four generation units G. The power system comprises a power network where electrical energy is transmitted from the generation units G to loads 35 indicated by arrows. The power network comprises four nodes, a first node 36, a second 37, a third node 38 and a fourth node 39, which are connected by power lines. In a first power line [36, 37] between the first node 36 and the second node 37, an active device 40 is installed which is controlled by a local control unit 41 and whose function is to adjust an electric quantity of the power system such as the current or the active or reactive power flowing along the first power line [36, 37]. Every control action in the active device 40 affects not only the electric quantity in the first power line [36, 37] but also in all other power line connections between the first and the second node, where the magnitude of change in each line depends on the overall topology of the power network. The other power line connections between the first and the second node 36 and 37 are for example the connection along a second power line [36, 38] between the first and the third node plus a third power line [38, 37] between the third and the second node as well as a connection along the second power line [36, 38] plus a fourth power line [38, 39] between the third and the fourth node plus a fifth power line [39, 37] between the fourth and the second node. The control actions in the active device 40 which are all originated and controlled by the local control unit 41, are time stamped and stored together with the time stamp in the local control unit 41. In proximity to the fourth node 39, a remote measurement unit 42 is installed which comprises a device 30 according to FIG. 4 to perform the prediction method according to the invention. The local control unit 41 and the remote measurement unit 42 are connected via a communication channel 43, which can be wired or wireless.

The remote measurement unit 42 monitors the state of the power system by predicting values of the at least one electric quantity of the power system based on measurements taken in the third power line [38, 37] and by comparing the predicted values with corresponding measurements. If a change in the state of the power system is detected by the remote measurement unit 42, the unit 42 sends out a notification together with time stamped data to the local control unit 41. Alternatively, the local control unit 41 may request the latest data determined by the remote measurement unit 42 to be sent, if a control action has been performed. The local control unit 41 compares the received time stamped data with the locally stored time stamped information about control actions in order to determine if and to what extent the fourth power line

[38, 39] can be influenced by a control action in the active device 40. If a certain topology and connectivity of the power network is assumed then a certain magnitude of control action should result in a certain magnitude of change in the state of the power system at the point where the remote measurement unit 42 is installed. Therefore the local control unit 41 tries to find those of the data from the remote measurement unit 42 whose timestamp matches the timestamp of one of the control actions. For these data, the ratio between the magnitude of the control action and the resulting change in the state of the power system measured by the remote measurement unit 42 is determined and analysed.

If for example the current in the fourth power line [38, 39] becomes so high that the power line reaches a thermal limit, an updated information about if and how the flow in the fourth power line [38, 39] can still be effected by the active device 40 is very useful in order to adjust the next control actions accordingly. Therefore, the local control unit 41 either initializes a special control action in the active device 40 and analyses the data then received from the remote measurement unit 42 or the local control unit 41 uses the latest data matching to a control action which has just recently taken place, after the problem in the fourth power line [38, 39] occurred. The updated information about the ratio between the magnitude of control action and the resulting change in the state of the power system can then be used to directly adjust the next control actions or to initiate further analysis.

A special example is the case where one or more of the power lines are disconnected from the network. If for example the second power line [36, 38] is disconnected, a control action in the active device 40 will not result in any change in the state of the power system as is detectable from the remote measurement unit 42.

A device 30 to predict a state of a power system can therefore be used advantageously to determine to what extent it is possible to influence the current or power flow of remote power lines, where the remote power lines form parallel connections to a power line with an active device 40. In a first special embodiment, this information about the controllability of the flow in remote power lines is used to determine the connectivity of at least a part of the power network. This is advantageous especially in the aftermath of a disturbance of the power network when the actual status and configuration of the power network is unclear. In a second special embodiment, the information about the controllability of the flow in remote power lines is used for thermal control of at least one remote power line in the power network, i.e. the flow through that line is adjusted in order to respect thermal limits of the line. Depending on the size and structure of the power network, more than just one prediction devices 30 can be installed remotely from the active device 40, where all devices 30 would communicate with the local control unit 41.

What is claimed is:

1. A method to predict a state of a power system with a computing device, comprising the steps of using the computing device to perform a Fast Fourier Transform on measured samples of a periodic waveform signal in order for the computing device to determine a frequency spectrum of the periodic waveform signal, where the computing device derives the periodic waveform signal from at least one measurable electric quantity of the power system and is representative of the state of the power system, the computing device performing the following steps:

determining frequencies and related complex amplitudes at selected peaks in the frequency spectrum and storing the frequencies and amplitudes together with a time stamp in a storage device connected to the computing device, determining and storing one or more predicted values of the periodic waveform signal ($\phi$) in the time domain at one or more prediction times by calculating a sum of sinusoidal signals at the corresponding prediction times, each of the sinusoidal signals based on one of the determined frequencies and its related complex amplitude and the time stamp, comparing each of the one or more predicted values with a measured value derived from a measurement of the at least one electric quantity of the power system, where the one or more prediction times each equal to a point in time when the corresponding measurement was taken, and generating a notification based on a change in the state of the power system if a select number of differences between the one or more predicted values and the corresponding measured values each exceed a predetermined limit.

2. The method according to claim 1, where the predicted value is determined based on the equation $$\phi_p = \text{Re}\left[\sum_i (A_i \cdot e^{2\pi f_i(t_p - t_0)})\right]$$

where $\phi_p$ is the predicted value, i is an index to number consecutively the determined frequencies $f_i$, and their corresponding complex amplitudes $A_i$, $t_0$ is the time stamp when the frequencies $f_i$, and amplitudes $A_i$, were determined and $t_p$ is the prediction time.

3. The method according to claim 1, where the frequencies and related complex amplitudes are determined from peaks in the frequency spectrum whose amplitude exceeds a select amplitude limit.

4. The method according to claim 1, where the frequencies and related complex amplitudes are determined after the frequency spectrum was filtered with a frequency filter.

5. The method according to claim 1, where said computing device comprises a real-time operating system and where the step of determining the predicted value is performed simultaneously with the steps of performing a Fast Fourier Transform and determining the frequencies and related complex amplitudes.

6. The method according to claim 1, further comprising a network connection and wherein the computing device is connected to the network connection such that the measured values are compared to the corresponding of the multiple predicted values substantially simultaneous with when the measurements are performed.

7. The method according to claim 1, where the state is the absence of short-circuits in the power system.

8. The method according to claim 1, where the power system is a power grid and where the state is the availability of a power transmission line in the grid.

9. The method according to claim 1, where the power system comprises a power transform with a tap changer and where the state is the quality of operation of the tap changer.

10. The method according to claim 2, where the frequencies and related complex amplitudes are determined from peaks in the frequency spectrum whose amplitude exceeds a select amplitude limit.

* * * * *